United States Patent [19]
Hu

[11] Patent Number: 5,633,200
[45] Date of Patent: May 27, 1997

[54] PROCESS FOR MANUFACTURING A LARGE GRAIN TUNGSTEN NITRIDE FILM AND PROCESS FOR MANUFACTURING A LIGHTLY NITRIDED TITANIUM SALICIDE DIFFUSION BARRIER WITH A LARGE GRAIN TUNGSTEN NITRIDE COVER LAYER

[75] Inventor: Yongjun Hu, Boise, Id.

[73] Assignee: Micron Technology, Inc., Boise, Id.

[21] Appl. No.: 653,428

[22] Filed: May 24, 1996

[51] Int. Cl.$^6$ .................................................. H01L 21/283
[52] U.S. Cl. .................... 438/653; 204/192.17; 438/660; 438/659; 438/643
[58] Field of Search .................... 437/24, 41 GS, 437/187, 190, 192, 193, 200, 245; 204/192.17, 298.07; 257/751, 755, 763, 764

[56] References Cited

U.S. PATENT DOCUMENTS

| | | | |
|---|---|---|---|
| 4,782,380 | 11/1988 | Shankar et al. | 357/71 |
| 4,847,111 | 7/1989 | Chow et al. | 427/38 |
| 4,897,368 | 1/1990 | Kobushi et al. | 437/200 |
| 4,927,505 | 5/1990 | Sharma et al. | 204/34.5 |
| 4,976,839 | 12/1990 | Inoue | 204/192.17 |
| 5,075,251 | 12/1991 | Torres et al. | 437/200 |
| 5,162,262 | 11/1992 | Ajika et al. | 437/200 |
| 5,188,979 | 2/1993 | Filipiak | 437/192 |
| 5,286,676 | 2/1994 | Kruger et al. | 437/190 |
| 5,318,924 | 6/1994 | Lin et al. | 437/192 |

FOREIGN PATENT DOCUMENTS

| | | | |
|---|---|---|---|
| 3-11735 | 1/1991 | Japan | 437/190 |
| 5-347274 | 12/1993 | Japan | 437/190 |

OTHER PUBLICATIONS

Hsieh, J., et al., "Collimated Liners . . . ", Conf. Proc. VLSI–IX, 1994, Materials Research Society, pp. 207–213.

Shingubara, S., et al., "Submicron Hole Filling . . . ", Conf. Proc., VLSI–VIII, 1993, Materials Research Society, pp. 257–266.

Lin, J. et al., "Aluminum Contact Filling . . . ", Conf. Proc., VLSI–VII, 1992, Materials Research Society, pp. 535–540.

Joshi, R., et al., "Collimated Sputtering . . . ", Conf. Proc., VLSI–VIII, 1993 Materials Research Society, pp. 273–279.

Ramaswami, S., et al., "Development of a Coherent Ti/TiN . . . ", Conf. Proc., VLSI–IX, 1994 Mat. Res. Soc., pp. 215–221.

*Primary Examiner*—T. N. Quach
*Attorney, Agent, or Firm*—Workman, Nydegger & Seeley

[57] ABSTRACT

Disclosed herein is a process for manufacturing a smooth, large grain tungsten nitride film. Under the process, tungsten nitride is deposited by physical vapor deposition in an environment of nitrogen. The nitrogen content of the environment is selected at an operating level wherein primarily tungsten is sputtered with only a light nucleation of tungsten nitride being evenly distributed in the tungsten. A separate grain growth step is subsequently conducted in an environment of nitrogen to grow a film of large grain tungsten nitride. Also disclosed is a stack structure suitable for MOS memory circuits incorporating a lightly nitrided titanium salicide diffusion barrier with a covering of tungsten nitride. The stack structure is formed in accordance with the tungsten nitride film manufacturing process and exhibits high thermal stability, low resistivity, long range agglomeration blocking, and high surface smoothness.

33 Claims, 3 Drawing Sheets

PROCESS FOR MANUFACTURING A LARGE GRAIN TUNGSTEN NITRIDE FILM AND PROCESS FOR MANUFACTURING A LIGHTLY NITRIDED TITANIUM SALICIDE DIFFUSION BARRIER WITH A LARGE GRAIN TUNGSTEN NITRIDE COVER LAYER

BACKGROUND OF THE INVENTION

1. The Field of the Invention

The present invention relates to the formation of a tungsten nitride film situated on a semiconductor wafer. More particularly, the present invention is directed to the formation of a large grain tungsten nitride film situated on a semiconductor wafer in a process suitable for forming a diffusion barrier and for forming a titanium salicide stack structure with a tungsten nitride cover layer.

2. The Relevant Technology

In the manufacturing of integrated circuits, barriers are often needed to prevent the diffusion of one material to an adjacent material. For instance, when aluminum contacts silicon surfaces, spiking can occur, and when aluminum comes into direct contact with tungsten, a highly resistive alloy is formed. Diffusion barriers are structures commonly used to prevent such undesirable reactions.

Titanium nitride has formerly been the material of choice for forming diffusion barriers and adhesive layers where conductive interfaces must be maintained. More recently, however, tungsten nitride has begun to appear more favorable and is in many applications replacing titanium nitride. Tungsten nitride has advantages over titanium nitride in that it has a lower resistivity and is thus more suitable for use in conductive interfaces in high speed applications. It is also more thermally stable, making it more suitable for the high temperature processing common in integrated circuit manufacturing.

One conventional method of forming tungsten nitride diffusion barriers is with chemical vapor deposition (CVD). Conventional chemical vapor deposition processes react tungsten with gaseous nitrogen at a high temperature in atmosphere of fluorine to form a film of tungsten nitride. Problems attendant to this process include the detrimental tendency of the fluorine to attack exposed surfaces of semiconductor wafers on which the diffusion barrier is being formed. The lack of cleanliness of chemical vapor deposition processes also presents problems. Consequently, the art has looked to other methods of depositing tungsten nitride films.

Physical vapor deposition (PVD) is another convention method of forming tungsten nitride diffusion barriers and is an alternative to the use of chemical vapor deposition for depositing tungsten nitride. The conventional physical vapor deposition technology involves reactive sputtering from a tungsten target in an atmosphere of gaseous nitrogen with an argon carrier gas. In this conventional saturated reactive sputtering mode, the volume ratio of nitrogen ($N_2$) to the argon carrier gas is selected such that the tungsten target is fully nitrided by surface dissociated nitrogen.

This type of conventional PVD process is highly reactive and causes simultaneous high density, nonuniform nucleation and grain growth, and results in a highly columnar, small grain film with a high resistivity. The small grain size, when the grains come into contact with adjacent layers such as aluminum which is of a large grain size, tends to cause stress at the interface between the layers and can cause the layers to peel away from each other. Also, the high amount and irregularity of the grains formed by the conventional process tend to cause voids, which give rise to electromigration and consequently, reduced diffusion barrier abilities. Voids are especially prone to forming at interfaces between adjoining layers.

A further problem with the conventional physical vapor deposition process is a columnar structure that is exhibited by the resulting film. The columnar structure, which appears as spikes between the grains, serves as a channel for diffusion and reduce the effectiveness of the structure as a diffusion barrier.

Figure 1:
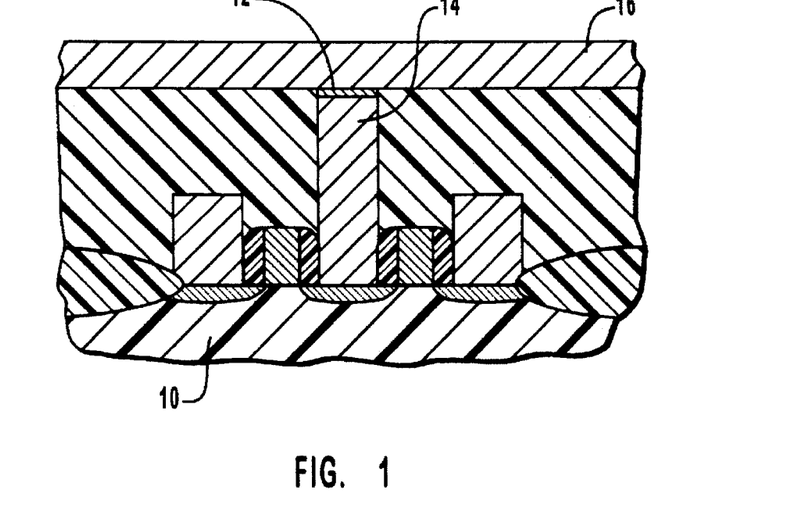
FIG. 1 is a cross-sectional depiction of a tungsten plug structure utilizing a tungsten nitride diffusion barrier.

One application for tungsten nitride films is the formation of diffusion barriers between the tungsten of tungsten plugs and adjoining metallization layers on the surface of the wafer. Such a diffusion barrier is shown in FIG. 1. Therein is shown a tungsten plug 14 extending down to a silicon substrate 10 with an overlying metallization layer 16 and an intervening diffusion barrier 12. The tungsten plug structure is one example of an application where tungsten nitride has been found as a suitable replacement for titanium nitride, as it is easily formed over the tungsten plug. Nevertheless, void formation and interfacial stress inherent to the conventional physical vapor deposition processes, along with the aforementioned problems associated with fluorine processing and cleanliness for chemical vapor deposition processes are detriments to the use of tungsten nitride for such applications.

A further application where an improved method for forming tungsten nitride films could be favorably used is in the formation of low resistivity tungsten nitride/titanium silicide stack. A titanium silicide ($TiSi_2$) self aligned diffusion barrier, known as titanium salicide, is formed by sputtering titanium on a polysilicon and annealing the deposited titanium at 650° C. after masking in a gaseous nitrogen environment to form titanium salicide in a C-49 phase. A second anneal at 850° C. transforms the titanium salicide to a more thermally stable C-54 phase and is followed by a standard wet strip. Titanium salicide stacks are commonly used for forming word and bit lines in DRAM memory structures and for forming local interconnects to CMOS gate structures.

The problems exhibited by conventional titanium silicide structures include agglomeration at the titanium silicide and polysilicon interface and decomposition of the titanium silicide back into titanium and silicon at high temperatures that results in high resistivity.

It is apparent from the above discussion that a need exists for a new process of forming a high quality tungsten nitride film which overcomes the problems existing with conventional chemical vapor deposition and physical vapor deposition processes, and which can be used to form a suitable diffusion barrier that has low resistivity, large grain size, low interfacial stress, and which is thermally stable. It is also apparent that such a process would be highly beneficial if it were compatible with and solved the aforementioned problems existent with processes for forming the titanium salicide stack structure of the prior art.

SUMMARY AND OBJECTS OF THE INVENTION

The present invention seeks to resolve the above and other problems that have been experienced in the art. More particularly, the present invention constitutes an advancement in the art by providing a process for tungsten nitride film formation which achieves each of the objects listed below.

It is an object of the present invention to provide a process for forming a tungsten nitride film of large grain size which exhibits high thermal stability and high electrical conductivity.

It is also an object of the present invention to provide such a process for forming a tungsten nitride film which results in a film which forms an effective diffusion barrier with a columnless, smooth surface.

It is another object of the present invention to provide a process for forming a tungsten nitride film which utilizes uniform nucleation to form near epitaxial quality large grain film with low stress.

It is yet another object of the present invention to provide such a process for forming a tungsten nitride film which is an alternative to chemical vapor deposition technology and which is suitable for forming a diffusion barrier between a tungsten plug and an aluminum interconnect line in a CMOS memory structure.

It is further an object of the present invention to provide such a process which can be used to form a lightly nitrided titanium salicide stack having a tungsten nitride film covering which exhibits reduced decomposition, reduced effect of long range agglomeration, and reduced film resistivity, as well as high surface smoothness, high thermal stability, and high grain uniformity.

To achieve the foregoing objects, and in accordance with the invention as embodied and broadly described herein in the preferred embodiment, a process is provided for manufacturing tungsten nitride with physical vapor deposition (PVD) which results in a large grain, low stress film. Also provided is an application of the tungsten nitride film used as a cover layer for a lightly nitrided titanium salicide stack.

The process of the present invention for manufacturing a tungsten nitride film comprises in a first step, producing an underlying surface layer upon which the tungsten nitride film is to be formed. The underlying surface layer may comprise tungsten, as when forming a diffusion barrier between a tungsten plug and an overlying aluminum interconnect line, or the underlying layer may be doped silicon, polysilicon, titanium, or any other suitable material for semiconductor applications.

In a further step, tungsten-rich tungsten nitride ($WN_x$) is deposited on the underlying layer using unsaturated physical vapor deposition reactive sputtering in a nitrogen environment. This is typically conducted in a physical vapor deposition chamber such as the Varian M2000 chamber manufactured by Varian Associates of Palo Alto, Calif. The Varian M2000 chamber is set with parameters in a known manner in the art, with the exception of the nitrogen content, which is set at or close to an optimum nitrogen content level.

In one embodiment, a gaseous mixture of nitrogen in an argon carrier is selected and passed into the PVD chamber. The gaseous mixture is selected to have an optimum nitrogen content level that causes a light nucleation of tungsten nitride to result in the deposited tungsten film and which results in no tungsten nitride grain growth. A light, highly uniform nucleation of tungsten nitride results from the low nitrogen content which is uniformly distributed to serve as nuclei for later grain growth. Thus, the PVD process is used as a uniform nucleation process but not a grain growth process.

The optimum nitrogen content level is the nitrogen/argon gas mixture that causes surfaces adjacent to the target such as side shields to be substantially coated with nitrogen from the nitrogen environment, but cause the target to be only lightly coated.

Examples of mixtures for forming the nitrogen environment include, for example, atomic nitrogen in a plasma driven process, diatomic nitride, and nitrous oxide in an argon carrier gas.

In order to determine the optimum nitrogen content operating level, the following steps are performed. First, using the physical vapor deposition chamber and operating parameters that will be used during the deposition, the tungsten deposition rate is experimentally calculated as a function of the nitrogen content in the physical vapor deposition chamber environment and plotted, with the tungsten deposition rate being plotted on one axis and the nitrogen content from 0 to approximately 100% volume ratio in argon being plotted on the second axis. The resulting plot will have a curve that starts out with a slight taper, drops sharply, and then tapers out and substantially levels off again at the bottom. This curve will occur at different levels of nitrogen content and differing tungsten deposition rate levels, but the characteristic slope of the curve, with the sharp drop and leveling off at the bottom has been found to be consistent at different power levels and operating parameters and within various chambers.

The nitrogen content operating level is selected to correspond to just prior to the point on the plot of the steepest deposition rate slope in the downward direction, which also corresponds approximately to the point of maximum rate of change of the slope in the downward direction. Once the nitrogen content operating level has been selected, the tungsten deposition is conducted within the physical vapor deposition chamber to form a tungsten film with lightly nucleated and uniformly distributed tungsten nitride seeding.

The next step is to grow a near epitaxial quality crystalline tungsten nitride structure from the tungsten film. This is known as "grain growth." The grain growth step is conducted by heating the tungsten film in a nitrogen environment, typically to a temperature of between about 600° C. and 700° C., and using a rapid thermal nitridization process.

The resulting tungsten nitride film exhibits large grain structure that will result in low stress to adjoining layers, a high surface smoothness, and a high thermal stability, thus providing the capability of serving as an improved diffusion barrier.

One application of the tungsten nitride diffusion barrier of the present invention is to form a cover layer to a titanium salicide layer. When so doing, the first step is to form an underlying layer on which to form the titanium salicide. The underlying layer is typically polysilicon, though it could also comprise doped silicon, or other suitable layers. The underlying layer is lightly nitrided in an ion implantation tool such as Varian's SHC-80, typically with a power of about 10 KeV and with a concentration of approximately $10^{13}$ nitrogen atoms/cm$^2$.

Subsequently, a titanium film is deposited over the underlying layer using physical vapor deposition in an environment of light nitridization. The light nitridization typically comprises a volume of nitrogen of up to about 3% in an inert carrier gas such as argon.

In a further step, the lightly nitrided titanium film is annealed in an atmosphere of nitrogen to form titanium nitride. In a typical process, this comprises a first anneal at about 650° C. followed by a stripping of unreacted titanium remaining on the surface, and a second anneal conducted at approximately 850° C., which transforms the titanium salicide to a less resistive and more thermally stable C-54 phase species.

Tungsten is then deposited in accordance with the process for manufacturing a tungsten film as described above, and is grown into tungsten nitride, also in accordance with the process as described above.

The resulting lightly nitrided titanium salicide structure exhibits beneficial qualities for use in structures such as word and bit lines and interconnect access lines, with a reduced tendency to decompose or agglomerate over long range due to nitridization which forms in grain boundaries and inhibits grain boundary movement. AFM studies have shown that grain uniformity is highly improved, as is surface smoothness and thermal stability during rapid thermal annealing at 650° C. and 850° C. after the titanium strip. The addition of the tungsten nitride cover layer produces a large grain structure at the surface which is resistant to deposition at high temperatures and exhibits stability up to 850° C. in furnace anneals and 1000° C. in rapid thermal anneals.

BRIEF DESCRIPTION OF THE DRAWINGS

In order that the manner in which the above-recited and other advantages and objects of the invention are obtained will be understood, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention comprises a process for manufacturing tungsten nitride films with a large grain size with high uniformity, a smooth surface, and a non-columnar structure. The process is highly suitable for use as a diffusion barrier. Also disclosed is an application of the process of the present invention for manufacturing a titanium salicide stack structure with a tungsten nitride cover layer.

The process of the present invention for manufacturing tungsten nitride films comprises the use of physical vapor deposition (PVD) to deposit a tungsten layer and to uniformly nucleate tungsten nitride seeds within the tungsten layer. This is achieved by sputtering in an environment with a low nitrogen content. Once the tungsten layer is deposited and nucleated, a large grain tungsten nitride growth process under controlled conditions is performed. In creating the environment, the nitrogen content is selected at or around an optimum nitrogen content operating level wherein the tungsten nitride is uniformly nucleated and such that no grain growth occurs in the layer of tungsten during the tungsten deposition. Thus, nucleation and growth occur at separate times in a controlled process resulting in a nucleation that is uniform, and grains that are uniform and large in size.

The first step of the process of the present invention is tungsten deposition. This is performed using physical vapor deposition reactive sputtering in a physical vapor deposition chamber. One example of a physical vapor deposition chamber suitable for this procedure is the Varian M2000 chamber.

Integral to the deposition of tungsten as a nucleation stage is setting of the nitrogen content operating level of the low content nitrogen environment of the physical vapor deposition chamber so as to set the ratio of nitrogen to inert carrier gas during the deposition at an operating level corresponding to or close to the optimum nitrogen content operating level. While the nitrogen content operating level will vary for different PVD chambers, power levels, and other parameters, a process has been devised which can be universally and effectively applied to determine the proper nitrogen content operating level. The nitrogen content operating level is determined after experimentally plotting the curve of tungsten deposition as a function of the nitrogen content in the inert carrier gas environment for the specific physical vapor deposition chamber, power level and other fixed parameters that are to be used for deposition.

Figure 2:
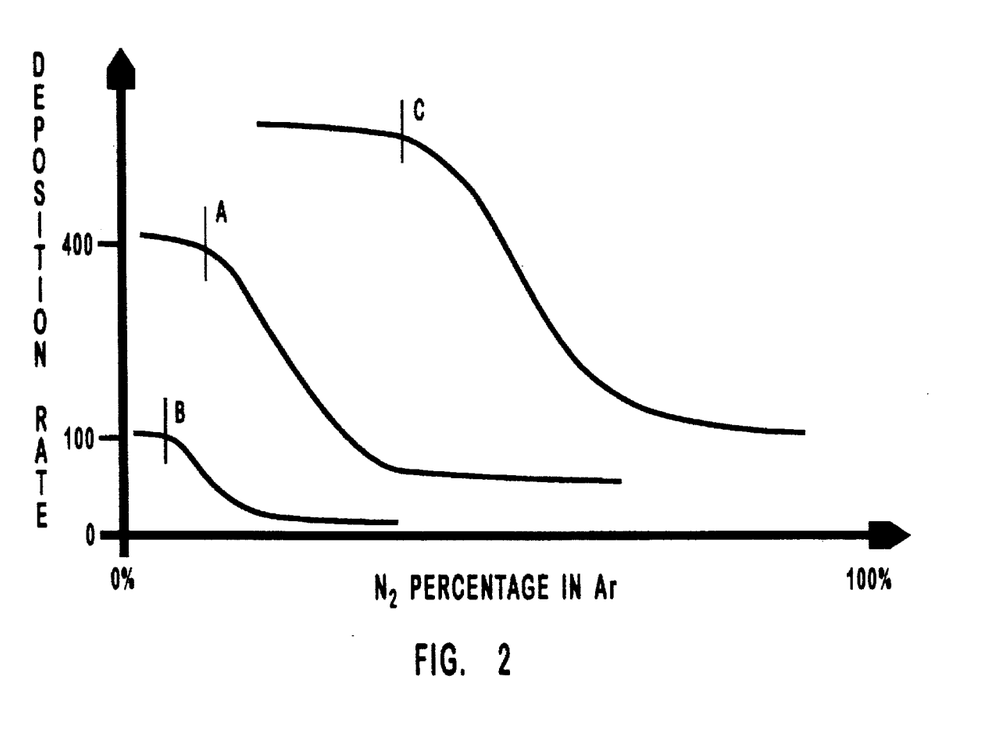
FIG. 2 is a graph plotting tungsten deposition rate as a function of nitrogen content in a physical vapor deposition process.

A typical plot will appear as depicted in FIG. 2. Therein are shown three different curves corresponding to different power levels in the same physical vapor deposition chamber. The tungsten deposition rate is plotted on the vertical axis in Angstroms per minute, and the relative nitrogen content in an argon environment is plotted on the horizontal axis by volume percentage of nitrogen content. For each of the different power level plots, it is noted that the tungsten deposition rate initially tapers gradually downward, transitions into a steep slope, and again levels out at the bottom. Thus, each is in substantially the shape of an outward pointing elbow. Each plot has this basic characteristic curve shape, even though the curves occur at different locations on the graph. Thus, while the desired operating level will vary for the different power levels or other parameters which are used, the desired nitrogen content operating level will occur at approximately the same relative point along each curve. Points A, B and C, respectively, on each of the plots comprise the points wherein the deposition rate transitions from a slight slope to a steep slope. These points, just prior to the maximum downward slope of the plots and located at approximately the point of maximum rate of change of the slope of the curves in the downward direction, correspond to the optimum nitrogen content operating level for each respective curve.

The nitrogen content operating level need not be set at exactly the aforementioned optimum point for all operations, but it may also be set quantitatively within a broader range of within 15% of the optimum nitrogen content operating level, indicated in FIG. 2 as points A, B, and C for the respective curves. This broader range will be suitable for less demanding applications such as when forming a diffusion barrier to a smaller grained material such as titanium. A narrower, more exact range of within 3% of the optimum nitrogen content operating level is suitable for demanding applications such as larger grained aluminum which needs a better diffusion barrier and a larger grain film with less stress.

The range of settings wherein the nitrogen content is advantageous in uniform nucleation and preparation for grain growth will vary with different parameters such as power settings, as shown in the differing curves of FIG. 2. Nevertheless, the optimum nitrogen content operating level can be located by plotting the curves, and finding the transition point between a slight slope and a steep slope, as discussed above. Additionally, in locating the optimum nitrogen content operating level, it has been found than the optimum nitrogen content operating level tends to occur at the point where the maximum rate of change of deposition rate with respect to nitrogen percentage in the downward, or negative direction, occurs. That is, the optimum nitrogen content operating level corresponds to the transition points (A, B, and C), which occur at approximately the points of greatest variation in the slopes of the curves in the plot of FIG. 2.

Figure 3:
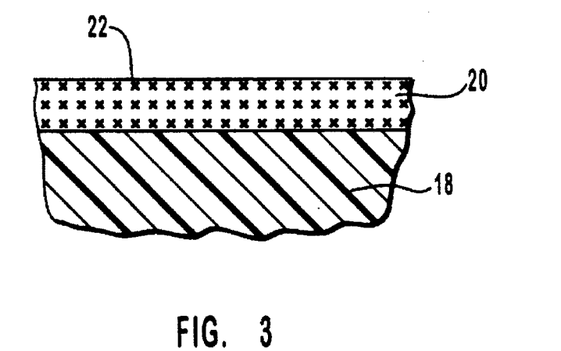
FIG. 3 is a cross-sectional depiction of a lightly nucleated tungsten film formed in a preliminary step of the process of the present invention.

The optimum nitrogen content operating level in mm corresponds to the gaseous nitrogen content which, while sufficient to form a light and uniform tungsten nitride seeding, and while sufficient to substantially coat side shields which are located in the chamber adjacent to the target, only lightly coats the target. The result of depositing tungsten at or about the optimum nitrogen content operating level is shown in FIG. 3. Thus, shown in FIG. 3 is a tungsten film 20 formed on a silicon substrate 18. Tungsten film 20, as a result of the process of the present invention, is formed with only a light nucleation of tungsten nitride 22 which is uniformly dispersed in tungsten film 20. Of course, tungsten film 20 could also be formed on a substrate other than silicon substrate 18.

When the target is substantially covered, the tungsten deposition rate is slowed. Further, tungsten nitride nucleation and grain growth occur simultaneously during deposition, and become uncontrollable. This is also known as saturation sputtering. By choosing a nitrogen content operating level close to the optimum nitrogen content operating level, the target will be only partially covered during tungsten deposition, will not yet be saturated, and a proper nucleation stage with a light, uniform nucleation of nitrogen in the layer of tungsten will be achieved. No tungsten nitride grain growth occurs in the tungsten layer during deposition, and the tungsten nuclei is prepared for a well controlled grain growth to occur in a separate step. Light nucleation defined herein as between about $4 \times 10^8$ to about $4 \times 10^{10}$ nuclei of tungsten nitride per $cm^2$ of tungsten.

The next step in the process is to grow large uniform tungsten nitride grains from the nucleated tungsten layer. As a result of the light and uniform tungsten nucleation resulting from the above-described process, a uniform large grain tungsten nitride film will result from the growth stage. Grain growth is conducted in a furnace or rapid thermal nitridation chamber such as the Centura HT, available from Applied Materials company of Santa Clara, Calif. Grain growth is preferably conducted at a temperature of between approximately 600° C. and 700° C. in a rapid thermal nitridization process, wherein the temperature is ramped up quickly to a high temperature, the high temperature is sustained for a short period of time, and is then ramped back down again. Other nitridation and grain growth procedures and parameters may also be suitable. The grain growth is conducted in an environment containing a heavy content of nitrogen molecules or atomic species which may comprise, for example, $N_2$ or could comprise an atomic plasma of nitrogen. The annealing temperature can be substantially lower than 600° C., down to 400° C., for example, if a high quality atomic nitrogen environment can be maintained.

Figure 4:
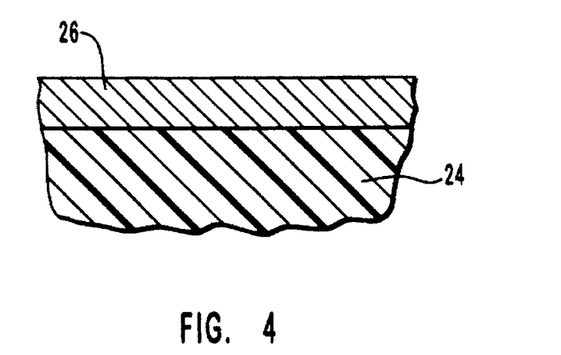
FIG. 4 is a cross-sectional depiction of a tungsten nitride film formed after grain growth by annealing of the nucleated tungsten film of FIG. 3 in a nitrogen-containing environment.

The result, depicted in FIG. 4, is the formation of a near epitaxial quality tungsten nitride film 26 which is suitable for use as a diffusion barrier. The film exhibits a smooth surface, uniform and large grains, a non-columnar structure, and incurs low stress on adjacent layers.

The tungsten nitride film of the present invention is highly suitable for forming an improved diffusion barrier of the type shown in FIG. 1. It has also been found to be beneficial and suitable for forming a thermally stable, low resistance, large grain cover layer for the titanium salicide stack structure discussed above.

Figure 5:
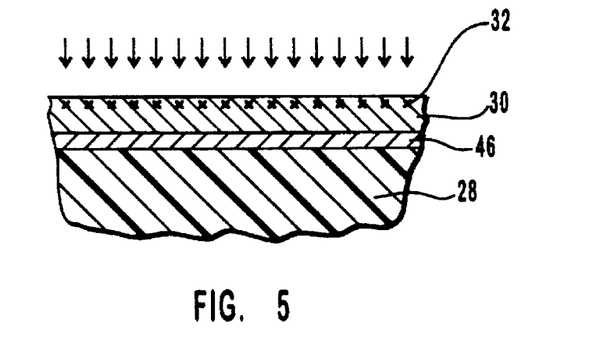
FIG. 5 is a cross-sectional depiction of a polysilicon film depicting a light nitridation on a polysilicon surface by nitrogen ion implantation.

In forming the titanium salicide stack structure with a tungsten nitride cover layer, the steps illustrated in FIGS. 5 through 10 are conducted. First, as shown in FIG. 5, an oxide barrier layer, such as a gate oxide layer 46 is formed on a silicon substrate 28. A surface layer such as a polysilicon film 30 is then formed on gate oxide layer 46. Next, a light nitridation of nitrogen atoms 32 is implanted into surface layer 30. The implantation of nitrogen atoms 32 is represented by arrows and is conducted using a physical vapor deposition chamber such as a Varian SHC-80 Ion Implanter. The implanter is set at a power of about 10 KeV to implement a concentration of about $10^{13}$ atoms of nitrogen per square centimeter. Phosphorous may be substituted for the nitrogen. When implanting phosphorous, the phosphorous is implanted in substantially the same quantities and with substantially the same stop range as nitrogen.

The next step, conducted without an intervening anneal, comprises depositing a titanium film 34 over polysilicon film 30. This is done in an environment containing a light amount of nitrogen, preferably comprising less than or equal to about three percent diatomic nitrogen in an inert carrier gas, such as argon, in the physical vapor deposition chamber. This yields the structure of FIG. 6. Shown therein is titanium film 34 with a light nitridation of nitrogen atoms 36.

Figure 7:
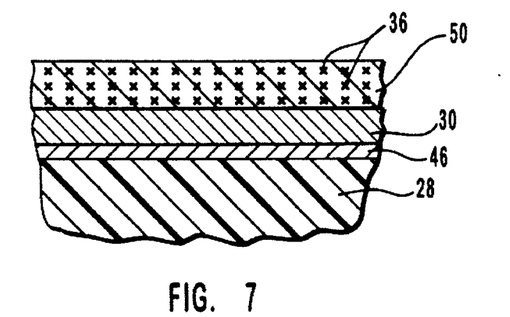
FIG. 7 is a cross-sectional representation of the polysilicon and titanium films of FIG. 6 after undergoing two anneal steps and a stripping of unreacted titanium to form titanium silicide.

In a further step, the titanium is transformed to titanium silicide with a rapid thermal anneal conducted at a temperature of 650° C. The unreacted titanium is then stripped from the surface, and a second anneal is conducted at a temperature of about 850° C. to rearrange the internal structure of the titanium silicide to a more thermally stable C-54 phase species. This results in the structure of FIG. 7, showing therein a resulting film of lightly nitrided titanium salicide ($TiSi_2$) 50. The light nitridation in the form of nitrogen atoms 36 remains in the film and at the titanium silicide and polysilicon interface.

The light nitridation slows down titanium silicide decomposition and blocks long range agglomeration at grain boundaries and at the polysilicon interface at high temperatures. AFM studies have also shown that the resulting structure with a light nitridation exhibits improved fine grain uniformity and surface smoothness. Thermal stability during rapid thermal annealing after the titanium strip is also improved. The lightly nitrided titanium silicide also acts as an effective diffusion barrier between underlying silicon and later deposited tungsten.

Figure 8:
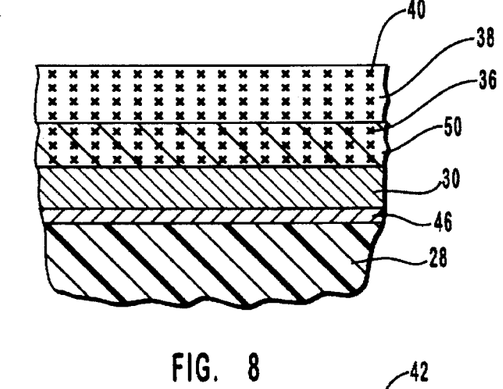
FIG. 8 is a cross-sectional representation of the polysilicon and titanium silicide films of FIG. 7 after undergoing a tungsten nitride nucleation stage.

The remaining steps comprise forming a tungsten nitride cover layer above the titanium salicide layer. The initial step in this process is illustrated in FIG. 8, and is substantially the same as the tungsten deposition step described in conjunction with the process for manufacturing tungsten nitride film disclosed above, involving the physical vapor deposition of a tungsten film 38 with a light nucleation of tungsten nitride 40. The tungsten deposition is conducted at or within the given ranges of the optimum nitrogen content operating level in the environment, in order to result in light and uniform nucleation as described above.

Next, tungsten nitride grains are grown. The grain growth, as discussed above, is preferably conducted with a rapid thermal nitridation process at a temperature of between about 600° C. and 700° C. The annealing temperature can be substantially lower than 600° C., and may be as low as 400° C., if a high quality atomic nitrogen environment can be maintained.

Figure 9:
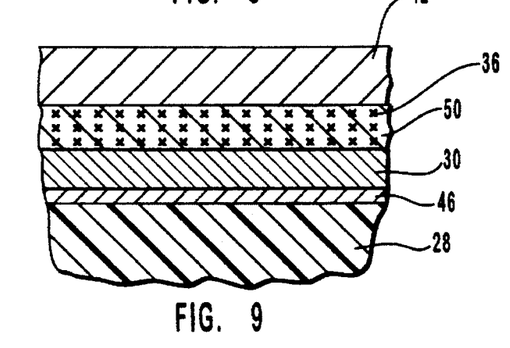
FIG. 9 is a cross-sectional representation of polysilicon, titanium silicide, and tungsten films of FIG. 8 showing the tungsten film transformed to tungsten nitride in a grain growth step.
Figure 10:
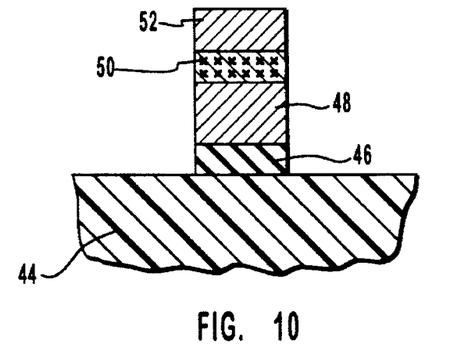
FIG. 10 is a cross-sectional representation of a word line stack incorporating the titanium silicide stack with a tungsten nitride covering structure.

A tungsten nitride cover layer 42 located over a titanium salicide stack structure 50, as shown in FIG. 9 results. The tungsten nitride and titanium salicide stack structure is highly suitable for applications such as the formation of local interconnects and word lines. Such a structure is shown in FIG. 10, where a gate region is shown formed with gate oxide layer 46, a polysilicon gate 48, and a tungsten salicide structure overlying polysilicon gate 48 in the form of titanium silicide layer 50 and tungsten nitride cover layer 52.

The use of tungsten nitride as a cover layer over titanium salicide is highly advantageous. Titanium silicide layer 50 forms an excellent diffusion barrier during nucleation of tungsten nitride and subsequent grain growth, while tungsten nitride cover layer 52 contributes to low resistivity and provides a thermally stable large grain surface with reduced agglomeration and decomposition. The use of tungsten nitride as a cover layer also makes it unnecessary to completely transform C-49 phase TiSi$_2$ to C-54 phase TiSi$_2$. This is advantageous in certain applications, as doing so is difficult if titanium silicide layer 50 is thin. A 100 nm tungsten nitride layer over a 25–50 nm titanium salicide stack has been found to exhibit high temperature stability up to 850° C. in furnace annealing and up to 1000° C. in a rapid thermal anneal in N$_2$.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for forming a tungsten nitride film, the process comprising:

(a) providing a surface layer located on a substrate of a semiconductor wafer;

(b) depositing a layer of tungsten on the surface layer with physical vapor deposition in an environment comprising a gaseous nitrogen content, the gaseous nitrogen content selected such that a light nucleation of tungsten nitride nuclei is incorporated in the layer of tungsten, the tungsten nitride nuclei being substantially uniformly dispersed throughout the tungsten layer; and (c) growing tungsten nitride grains in the tungsten layer in an environment containing nitrogen to form a layer of tungsten nitride.

2. A process as recited in claim 1, wherein substantially no tungsten nitride grain growth in the layer of tungsten occurs during the step of depositing a layer of tungsten on the surface layer.

3. A process as recited in claim 1, wherein the environment further comprises argon and a nitrogen-containing gas.

4. A process as recited in claim 1, further comprising the step, conducted prior to the step of providing a surface layer located on a substrate of a semiconductor wafer, of selecting a gaseous nitrogen content operating level in the environment comprising a gaseous nitrogen content.

5. A process as recited in claim 4, wherein the gaseous nitrogen content operating level is selected to correspond to an optimum gaseous nitrogen content operating level that causes the tungsten nitride nuclei to be substantially uniformly dispersed throughout the tungsten layer and that allows substantially no tungsten nitride grain growth in the layer of tungsten during the step of depositing a layer of tungsten on the surface layer.

6. A process as recited in claim 4, wherein the step of selecting the gaseous nitrogen content operating level comprises the further steps of:

(a) depositing multiple layers of tungsten on a test semiconductor wafer with physical vapor deposition in a physical vapor deposition chamber having an environment of varying gaseous nitrogen content;

(b) calculating and plotting the physical vapor deposition rate of tungsten as a function of the varying gaseous nitrogen content, thereby producing a plot of physical vapor deposition rate of tungsten as a function of gaseous nitrogen content that has a slope with at least a portion being substantially in the shape of an outward pointing elbow, the elbow comprising a first continuous section of the plot with a relatively slight downward slope, connected at a point of transition to a second continuous section of the plot with a relatively steep downward slope, the point of transition comprising an optimum gaseous nitrogen content operating level that causes the tungsten nitride nuclei to be substantially uniformly dispersed throughout the tungsten layer and that allows substantially no tungsten nitride grain growth in the layer of tungsten during the step of depositing a layer of tungsten on the surface layer; and (c) selecting the gaseous nitrogen content operating level of the environment comprising a gaseous nitrogen content to correspond to within approximately 15 percent of relative nitrogen content from the optimum gaseous nitrogen content operating level.

7. A process as recited in claim 6, wherein the point of transition comprises the point on the plot where the slope has the greatest rate of change in the downward direction.

8. A process as recited in claim 6, wherein the selected gaseous nitrogen content operating level of the environment comprising a gaseous nitrogen content is within a range of about three percent of relative nitrogen content from the optimum gaseous nitrogen content operating level.

9. A process as recited in claim 1, wherein the environment comprising a gaseous nitrogen content comprises gaseous nitrous oxide and a carrier gas comprising argon.

10. A process as recited in claim 1, wherein the step of growing tungsten nitride grains comprises heating the tungsten layer in an environment comprising a gaseous nitrogen content.

11. A process as recited in claim 10, wherein the step of growing tungsten nitride grains further comprises heating the layer of tungsten in a furnace at a temperature in the range of between about 400° C. and 700° C. in the environment comprising a gaseous nitrogen content.

12. A process as recited in claim 10, wherein the step of growing tungsten nitride grains comprises heating the layer of tungsten with a rapid thermal nitridization.

13. A process as recited in claim 1, wherein the physical vapor deposition comprises reactive sputtering.

14. A process as recited in claim 1, wherein the layer of tungsten nitride has a smooth surface and a large grain crystalline structure.

15. A process as recited in claim 1, wherein the substrate of a semiconductor wafer comprises a polysilicon substrate.

16. A process for forming a titanium salicide stack with a tungsten nitride cover layer, the process comprising:
   (a) depositing a layer of titanium on a silicon surface layer with physical vapor deposition in physical vapor deposition chamber having an environment containing gaseous nitrogen, said silicon surface layer being situated on a semiconductor wafer;
   (b) annealing the layer of titanium in an environment containing gaseous nitrogen to form a layer of titanium silicide;
   (c) depositing a layer of tungsten over the layer of titanium silicide with physical vapor deposition in an environment comprising a gaseous nitrogen content selected such that a light nucleation of tungsten nitride nuclei is incorporated in the layer of tungsten, the tungsten nitride nuclei being substantially uniformly dispersed throughout the tungsten layer; and
   (d) growing tungsten nitride grains in the tungsten layer in an environment containing gaseous nitrogen to form the layer of tungsten nitride.

17. A process as recited in claim 16, wherein the silicon surface layer comprises polysilicon.

18. A process as recited in claim 17, further comprising the step of forming a light nitridation on the silicon surface layer.

19. A process as recited in claim 18, wherein the step of forming a light nitridation on the silicon surface layer comprises implanting nitrogen into the silicon surface layer with a power of approximately 10 KeV and a dosage of about $10^{13}$ nitrogen atoms per cm$^2$ of the silicon surface layer.

20. A process as recited in claim 17, further comprising the step of implanting phosphorous into the silicon surface layer with a power of approximately 10 KeV and a dosage of about $10^{13}$ nitrogen atoms per cm$^2$ of the silicon surface layer.

21. A process as recited in claim 16, wherein the step of annealing the titanium layer comprises conducting a first anneal at about 650° C. and a second anneal at about 850° C.

22. A process as recited in claim 21, further comprising the step, prior the second anneal and after the first anneal, of stripping any unreacted titanium from the titanium silicide layer.

23. A process as recited in claim 16, wherein the environment comprising a gaseous nitrogen content comprises a nitrogen in a carrier gas with a volume in the range of between zero and three percent.

24. A process as recited in claim 16, further comprising the step, conducted prior to the step of providing a surface layer located on a substrate of a semiconductor wafer, of selecting a gaseous nitrogen content operating level in the environment comprising a gaseous nitrogen content.

25. A process as recited in claim 24, wherein the gaseous nitrogen content operating level is selected to correspond to an optimum gaseous nitrogen content operating level that causes the tungsten nitride nuclei to be substantially uniformly dispersed throughout the tungsten layer and that allows substantially no tungsten nitride grain growth in the layer of tungsten during the step of depositing a layer of tungsten on the surface layer.

26. A process as recited in claim 24, wherein the step of selecting the gaseous nitrogen content operating level comprises the further steps of:
   (a) depositing multiple layers of tungsten on a test semiconductor wafer with physical vapor deposition in a physical vapor deposition chamber having an environment of varying gaseous nitrogen content;
   (b) calculating and plotting the physical vapor deposition rate of tungsten as a function of the varying gaseous nitrogen content, thereby producing a plot of physical vapor deposition rate of tungsten as a function of gaseous nitrogen content that has a slope with at least a portion being substantially in the shape of an outward pointing elbow, the elbow comprising a first continuous section of the plot with a relatively slight downward slope, connected at a point of transition to a second continuous section of the plot with a relatively steep downward slope, the point of transition comprising an optimum gaseous nitrogen content operating level that causes the tungsten nitride nuclei to be substantially uniformly dispersed throughout the tungsten layer and that allows substantially no tungsten nitride grain growth in the layer of tungsten during the step of depositing a layer of tungsten on the surface layer; and
   (c) selecting the gaseous nitrogen content operating level of the environment comprising a gaseous nitrogen content to correspond to within approximately 15 percent of relative nitrogen content from the optimum gaseous nitrogen content operating level.

27. A process as recited in claim 26, wherein the point of transition comprises the point on the plot where the slope has the greatest rate of change in the downward direction.

28. A process as recited in claim 26, wherein the selected gaseous nitrogen content operating level of the environment comprising a gaseous nitrogen content is within a range of about three percent of relative nitrogen content from the optimum gaseous nitrogen content operating level.

29. A process as recited in claim 26, wherein the environment comprising a gaseous nitrogen content comprises gaseous nitrogen and a carrier gas comprising argon.

30. A process as recited in claim 26, wherein the step of growing tungsten nitride grains comprises heating the layer of tungsten with a rapid thermal nitridization.

31. A process as recited in claim 26, wherein the step of growing tungsten nitride grains comprises heating the layer of tungsten at a temperature of about 400° C. to 700° C.

32. A process for forming a titanium salicide stack with a tungsten nitride cover layer, the process comprising:
   (a) forming a light nitridation on a polysilicon surface layer located on a semiconductor wafer by implanting nitrogen into the polysilicon surface layer at a power of approximately 10 KeV with a dosage of about $10^{13}$ nitrogen atoms per square centimeter of polysilicon surface layer;

(b) depositing a layer of titanium on the polysilicon surface layer with physical vapor deposition in a physical vapor deposition chamber having an environment of a carrier gas and a volume of gaseous nitrogen in the range of between zero and three percent;

(c) annealing the layer of titanium in an environment of gaseous nitrogen to form a layer of titanium silicide;

(d) creating an environment comprising an inert gas and a variable gaseous nitrogen content in a physical vapor deposition chamber;

(e) depositing a layer of tungsten on the layer of titanium silicide with physical vapor deposition within the physical vapor deposition chamber in the environment comprising an inert gas and a variable gaseous nitrogen content, with the variable gaseous nitrogen content of the environment comprising an inert gas and a gaseous nitrogen content selected such that a light nucleation of tungsten nitride nuclei are incorporated into the layer of tungsten, the tungsten nitride nuclei being substantially uniformly dispersed throughout the tungsten layer with substantially no grain growth occurring while the layer tungsten is deposited; and (f) growing tungsten nitride grains in the tungsten layer in an environment of gaseous nitrogen at a temperature of between about 400° C. and 700° C. to form a substantially smooth layer of tungsten nitride with a large grain crystalline structure.

33. A process as recited in claim 32, wherein the step of selecting the gaseous nitrogen content comprises the further steps of:

(a) depositing multiple layers of tungsten on a test semiconductor wafer with physical vapor deposition in a physical vapor deposition chamber having an environment of varying gaseous nitrogen content;

(b) calculating and plotting the physical vapor deposition rate of tungsten as a function of the varying gaseous nitrogen content, thereby producing a plot of physical vapor deposition rate of tungsten as a function of gaseous nitrogen content that has a slope with at least a portion being substantially in the shape of an outward pointing elbow, the elbow comprising a first continuous section of the plot with a relatively slight downward slope, connected at a point of transition to a second continuous section of the plot with a relatively steep downward slope, the point of transition comprising an optimum gaseous nitrogen content operating level that causes the tungsten nitride nuclei to be substantially uniformly dispersed throughout the tungsten layer and that allows substantially no tungsten nitride grain growth in the layer of tungsten during the step of depositing a layer of tungsten on the surface layer; and (c) selecting the gaseous nitrogen content to correspond to within approximately three percent of relative nitrogen content from the optimum gaseous nitrogen content operating level.

* * * * *

UNITED STATES PATENT AND TRADEMARK OFFICE
CERTIFICATE OF CORRECTION

PATENT NO. : 5,633,200
DATED : May 27, 1997
INVENTOR(S) : Yongjun Hu

It is certified that error appears in the above-identified patent and that said Letters Patent are hereby corrected as shown below:

Cover Page, Other Publications, line 2, change "VLSI-1X" to --ULSI-IX--

Cover Page, Other Publicaitons, line 4, change "VLSI-VIII" to --ULSI-VIII--

Cover Page, Other Publications, line 7, change "VLSI-VII" to --ULSI-VII--

Cover Page, Other Publications, line 9, change "VLSI-VIII" to --ULSI-VIII--

Cover Page, Other Publications, line 11, change "VLSI-IX" to --ULSI-IX--

Col. 1, line 43, change "atmosphere" to --an atmosphere--

Figure 6:
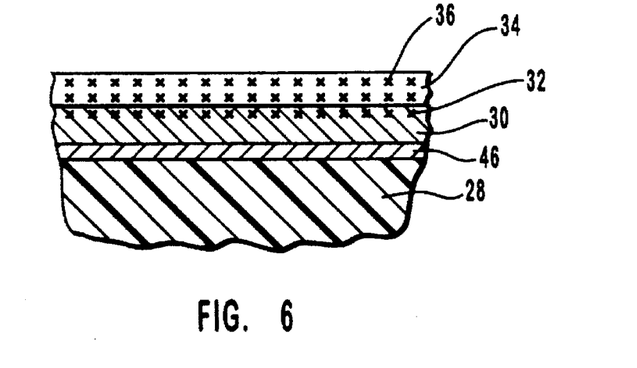
FIG. 6 is a cross-sectional depiction of the polysilicon film of FIG. 6 having a titanium film deposited thereon with a light nitridation.

Col. 5, line 50, change "FIG. 6" to --FIG. 5--

Col. 7, line 36, change "mm" to --turn--

Signed and Sealed this

Twenty-fourth Day of March, 1998

*Attest:*

BRUCE LEHMAN

*Attesting Officer*  *Commissioner of Patents and Trademarks*